(12) United States Patent
Song et al.

(10) Patent No.: US 10,199,297 B2
(45) Date of Patent: Feb. 5, 2019

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Chun Song, Shanghai (CN); Yi Zhong, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/828,190

(22) Filed: Nov. 30, 2017

(65) Prior Publication Data
US 2018/0158744 A1  Jun. 7, 2018

(30) Foreign Application Priority Data
Dec. 2, 2016   (CN) .......................... 2016 1 1110242

(51) Int. Cl.
*H01L 23/48*     (2006.01)
*H01L 23/10*     (2006.01)
(Continued)

(52) U.S. Cl.
CPC .............. *H01L 23/10* (2013.01); *H01L 21/70* (2013.01); *H01L 23/045* (2013.01);
(Continued)

(58) Field of Classification Search
CPC ................ H01L 2924/014; H01L 2224/73265
See application file for complete search history.

(56) References Cited

U.S. PATENT DOCUMENTS 4,860,443 A * 8/1989 Pesavento .............. H05K 3/305
 29/840
5,717,245 A * 2/1998 Pedder .............. H01L 23/49816
 257/664

(Continued)

OTHER PUBLICATIONS

The European Patent Office (EPO) the Extended European Search Report for 17204260.8 dated Apr. 30, 2018 7 Pages.

*Primary Examiner* — Thao P Le
(74) *Attorney, Agent, or Firm* — Anova Law Group, PLLC

(57) ABSTRACT

Semiconductor structures and fabrication methods thereof are provided. An exemplary semiconductor structure includes a semiconductor substrate having a device region and a protective region around the device region; a seal ring structure on the semiconductor substrate in the protective region; an electrical interconnect structure on the semiconductor substrate in the device region; an interlayer dielectric layer entirely covering the protective region on the seal ring structure and the electrical interconnect structure; a solder pad electrically connected with the electrical interconnect structure passing through a portion of the interlayer dielectric layer in the device region; a passivation layer on the interlayer dielectric layer and exposing the solder pad; and a conducive wire connected to the solder pad and across over a portion of the passivation layer in the protective region.

20 Claims, 4 Drawing Sheets

(51) Int. Cl.
  *H01L 23/58* (2006.01)
  *H01L 21/70* (2006.01)
  *H01L 23/045* (2006.01)
  *H01L 23/051* (2006.01)
  *H01L 23/00* (2006.01)
  *H01L 25/065* (2006.01)
  *H01L 25/07* (2006.01)
  *H01L 25/10* (2006.01)
  *H01L 25/16* (2006.01)
  *H01L 25/18* (2006.01)

(52) U.S. Cl.
  CPC .......... *H01L 23/051* (2013.01); *H01L 23/562* (2013.01); *H01L 23/564* (2013.01); *H01L 23/585* (2013.01); *H01L 24/05* (2013.01); *H01L 25/065* (2013.01); *H01L 25/07* (2013.01); *H01L 25/10* (2013.01); *H01L 25/16* (2013.01); *H01L 25/18* (2013.01)

(56) References Cited

U.S. PATENT DOCUMENTS

| | | | |
|---|---|---|---|
| 6,861,750 B2 * | 3/2005 | Zhao | H01L 23/3677 |
| | | | 257/666 |
| 6,879,023 B1 | 4/2005 | Gutierrez | |
| 7,161,239 B2 * | 1/2007 | Zhao | H01L 23/24 |
| | | | 257/706 |
| 2002/0066948 A1 * | 6/2002 | Kim | H01L 23/3128 |
| | | | 257/678 |
| 2011/0140283 A1 * | 6/2011 | Chandra | H01L 23/5385 |
| | | | 257/777 |
| 2013/0075859 A1 | 3/2013 | Kerber | |
| 2013/0270710 A1 * | 10/2013 | Chen | H01L 23/564 |
| | | | 257/774 |
| 2014/0266919 A1 * | 9/2014 | Chen | H01L 23/66 |
| | | | 343/700 MS |

* cited by examiner

SEMICONDUCTOR STRUCTURE AND FABRICATION METHOD THEREOF

CROSS-REFERENCES TO RELATED APPLICATIONS

This application claims the priority of Chinese patent application No. 201611110242.1, filed on Dec. 2, 2016, the entirety of which is incorporated herein by reference.

FIELD OF THE DISCLOSURE

The present disclosure generally relates to the field of semiconductor manufacturing technologies and, more particularly, relates to semiconductor structures and fabrication methods thereof.

BACKGROUND

With the continuous development of semiconductor technologies, the sizes of the integrated circuits (ICs) have been continuously reduced; and the performance of the semiconductor device has been continuously improved.

To reduce effect of external environments on the semiconductor devices in a chip, a seal ring structure is often formed around the semiconductor devices in the chip. To allow the seal ring structure to be able to reduce the stress generated by the external environments to the semiconductor devices, the seal ring structure often includes a metal structure.

In a packaging process of the chip, semiconductor devices may be electrically connected with the printed circuit board, or electrically connected with semiconductor devices in another chip, by conductive wires. The conductive wires thus need to cross over the seal ring structure to connect with the semiconductor devices in the chip.

Specifically, the packaging process may include forming semiconductor devices, such as transistors, etc., on a semiconductor substrate; forming an interconnect structure electrically connecting the semiconductor devices; forming solder pads on the interconnect structure; forming solder balls on the solder pads. The conductive wires electrically connect the semiconductor devices with the printed circuit board through the solder balls, or electrically connect the semiconductor devices in two chips together through the solder balls.

However, the performance of the semiconductor structure may be easily affected by conventional fabrication methods. The disclosed methods and semiconductor structures are directed to solve one or more problems set forth above and other problems in the art.

BRIEF SUMMARY OF THE DISCLOSURE

One aspect of the present disclosure includes a semiconductor structure. The semiconductor structure includes a semiconductor substrate having a device region and a protective region around the device region; a seal ring structure on the semiconductor substrate in the protective region; an electrical interconnect structure on the semiconductor substrate in the device region; an interlayer dielectric layer entirely covering the protective region on the seal ring structure and the electrical interconnect structure; a solder pad electrically connected with the electrical interconnect structure passing through a portion of the interlayer dielectric layer in the device region; a passivation layer on the interlayer dielectric layer and exposing the solder pad; and a conducive wire connected to the solder pad and across over a portion of the passivation layer in the protective region.

Another aspect of the present disclosure includes a method for fabricating a semiconductor structure. The method includes providing a semiconductor substrate having a device region and a protective region; forming an electrical interconnect structure on the semiconductor substrate in the device region; forming a seal ring structure on the semiconductor substrate in the protective region; forming an interlayer dielectric layer on the seal ring structure and on the electrical interconnect structure to entirely cover the protective region and to expose the electrical interconnect structure by an opening; forming a solder pad in the opening; forming a passivation layer exposing the solder pad on a portion of the interlayer dielectric layer in the protective region; and forming a conductive wire connected with the solder pad and across over a portion of the passivation layer in the protective region.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
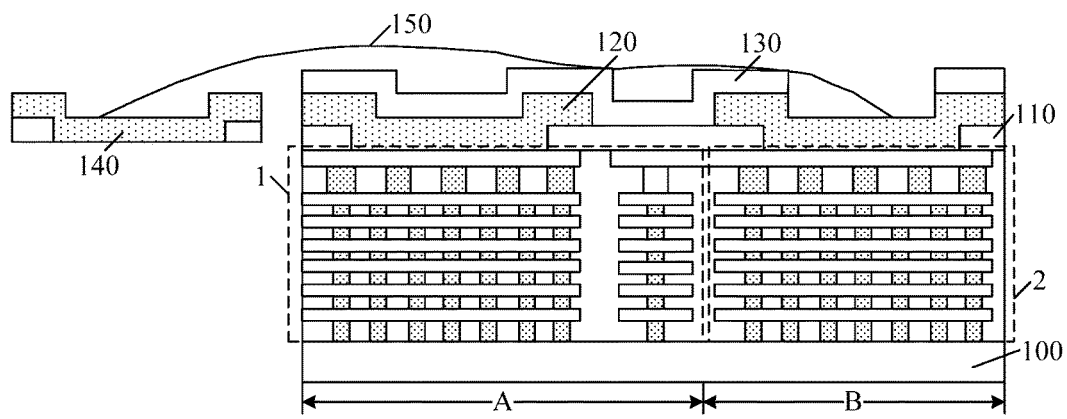
FIG. 1 illustrates a semiconductor structure.

FIG. 1 illustrates a semiconductor structure. As shown in FIG. 1, the semiconductor structure includes a semiconductor substrate 100. The semiconductor substrate 100 includes a device region "A" and a protective region "B" around the device region "A". The semiconductor structure also includes a seal ring structure 1 on the semiconductor substrate 100 in the protective region "B"; and device structures (not shown) on the semiconductor substrate 100 in the device region "B". Further, the semiconductor structure may also include an electrical interconnect structure 2 and an interlayer dielectric layer 110 on the seal ring structure 1 and the electrical interconnect structure 2. The interlayer dielectric layer 110 has an opening in the device region "B" and the protective region "A", respectively. A solder pad 120 is formed on the interlayer dielectric layer 110, in the opening and on portions of the side surfaces of the opening. Further, the semiconductor structure also includes a passivation layer 130 on the solder pad 120 in the protective region "A"; and a conductive wire 150 electrically connecting with the solder pad 120 in the device region "B". The conductive wire 150 is across over the passivation layer 130 in the protective region "A".

The protective region "A" is ring-shaped; and the device region "B" is within the protective region "A". The semiconductor structure needs the conductive wire 150 to connect an external chip with the solder pad 120 in the device region "A". During the process for forming the semiconductor structure, to reduce the number of the masks and simplify the process flow, another solder pad 120 is also formed on the top dielectric layer 110 in the protective region "A" when the solder pad 120 is formed on the interlayer dielectric layer 110 in the device region "B". When the external chip 140 is connected to the solder pad 120 on the interlayer dielectric layer 110 in the device region "A", the conductive wire 150 needs to be across over the protective region "A". Because the solder pad 120 is on the interlayer dielectric layer 110 in the device region "A", the top surface of the solder pad 120 on the interlayer dielectric layer 110 may be relatively high. Thus, the conductive wire 150 may easily contact with the passivation layer 130 on the interlayer dielectric layer 110 having the relatively high top surface. However, because the thickness of the passivation layer 130 may be substantially small, defects are easily formed in the passivation layer 130. Thus, the conductive wire 150 is easily connected with the solder pad 120 in the protective region "A". Accordingly, it is easy to have a leakage current issue in the semiconductor structure; and the performance of the semiconductor structure is adversely affected.

The present disclosure provides a semiconductor structure and a fabrication method thereof. The semiconductor structure may include a semiconductor substrate having a device region and a protective region around the device region; and a seal ring structure on the semiconductor substrate in the protective region. The semiconductor structure may also include an electrical interconnect structure on the semiconductor substrate in the device region; and an interlayer dielectric layer on the seal ring structure and the electrical interconnect structure, wherein the interlayer dielectric layer may cover the protective region entirely and the portion of the interlayer dielectric layer in the device region may have an opening exposing the electrical interconnect structure. Further, the semiconductor structure may also include a solder pad in the opening and a passivation layer exposing the solder pad on the interlayer dielectric layer; and a conductive wire electrically connected with the soldering and across the passivation layer in the protective region.

The conductive wire may be connected with an external chip across the protective region. Because the top interlayer dielectric may cover the seal ring structure entirely, the portion of the passivation layer in the protective region may have no protruding portion. Thus, the passivation layer may be uneasy to connect with the conductive wire. Thus, the isolation property between the seal ring structure and the conductive wire may be increased. Accordingly, it may be uneasy to form a leakage current in the semiconductor structure; and the performance of the semiconductor structure may be improved.

Figure 9:
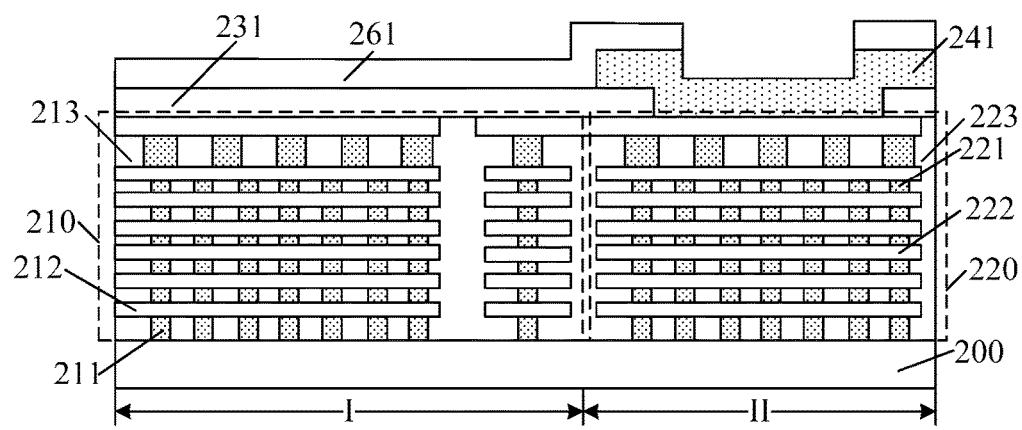
Figure 10:
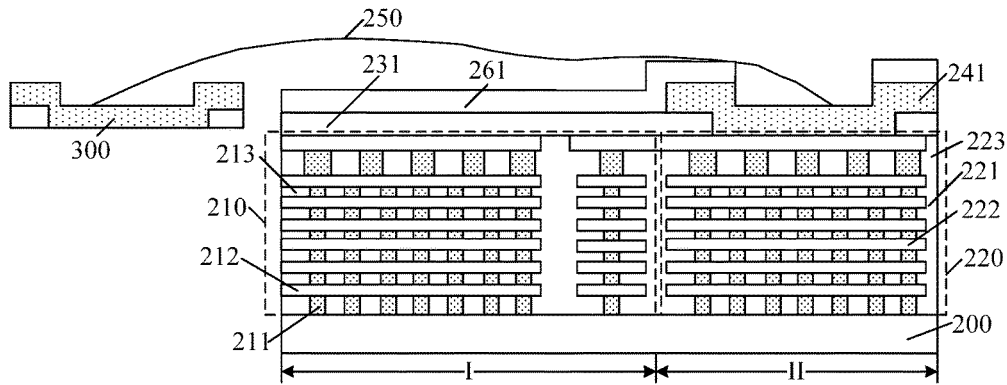
Figure 11:
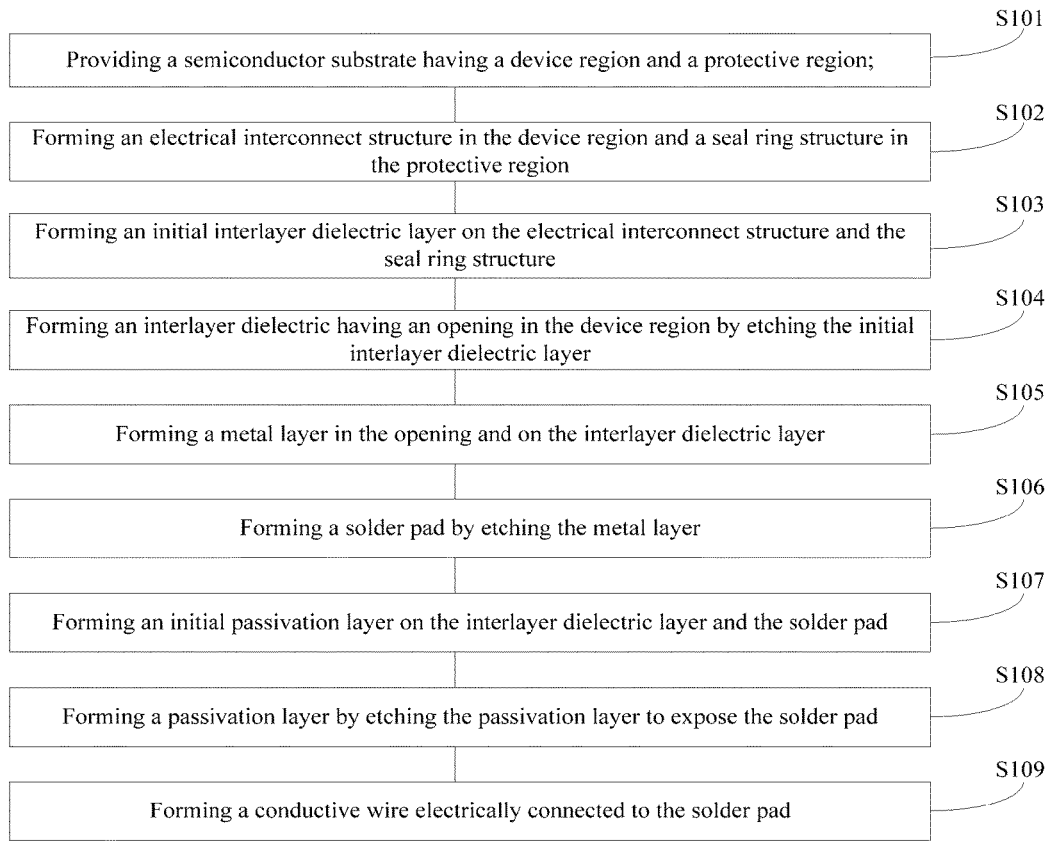
FIG. 11 illustrates an exemplary fabrication process of a semiconductor structure consistent with various disclosed embodiments.

FIG. 11 illustrates an exemplary fabrication process of a semiconductor structure consistent with the disclosed embodiments. FIGS. 2-10 illustrate structures corresponding to certain stages of the exemplary fabrication process.

Figure 2:
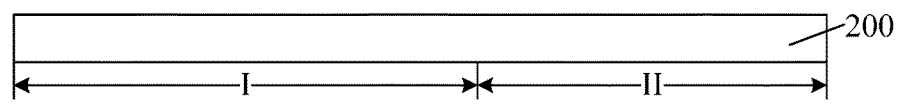
FIGS. 2-10 illustrate structures corresponding to certain stages during an exemplary fabrication process of a semiconductor structure consistent with various disclosed embodiments.

As shown in FIG. 11, at the beginning of the fabrication process, a semiconductor substrate is provided (S101). FIG. 2 illustrates a corresponding structure.

As shown in FIG. 2, a semiconductor substrate 200 is provided. The semiconductor substrate 200 may include a device region II and a protective region I around the device region II.

The protective region I may be used to form a seal ring structure to protect the device region II. The device region II may be used to form device structures.

In one embodiment, the protective region I may be ring-shaped. The device region II may be within or surrounded by the protective region I.

In one embodiment, the semiconductor substrate 200 may be a planar substrate. In some embodiments, the semiconductor substrate may include a base substrate and a plurality of fins on the base substrate.

In one embodiment, the semiconductor substrate 200 is a silicon substrate. In some embodiments, the semiconductor substrate may be a germanium substrate, a silicon germanium substrate, a silicon on insulator (SOI) substrate, or a germanium on insulator (GOI) substrate, etc.

After providing the semiconductor substrate, one or more device structures (not shown) may be formed on the semiconductor substrate 200 in the device region II. In one embodiment, the device structures may be MOS transistors. The MOS transistor may include a gate structure on the semiconductor substrate 200; and doped source/drain regions in the semiconductor substrate 200 at two sides of the gate structure. In some embodiments, the device structures may include diodes, transistors and/or resistors, etc.

Figure 3:
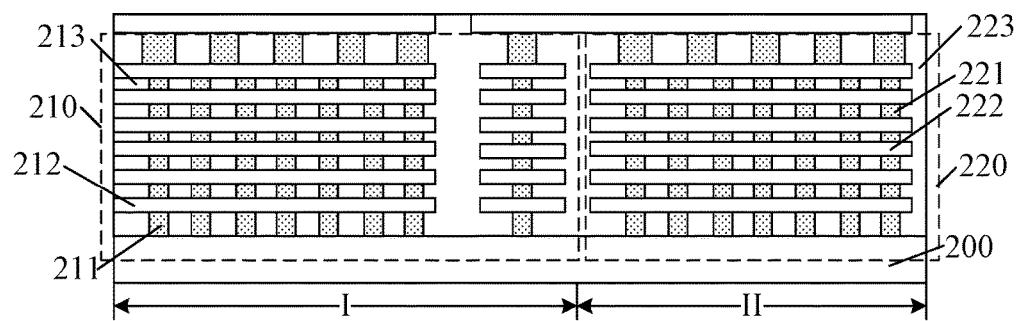

Returning to FIG. 11, after forming the device structures, an electrical interconnect structure and a seal ring structure may be formed (S102). FIG. 3 illustrates a corresponding structure.

As shown in FIG. 3, an electrical interconnect structure 220 is formed on the semiconductor structure 200 in the device region II; and a seal ring structure 210 is formed on the semiconductor substrate 200 in the protective region I.

The electrical interconnect structure 200 may be connected with the device structure (s) to connect the device structure(s) with an external chip. The seal ring structure 210 mays used to protect the device region II to reduce the interference of the external environment to the performance of the device structure(s).

In one embodiment, the seal ring structure 210 may include one or more protective units (not labeled). The protective unit may include a protective interlayer dielectric layers 213 on the semiconductor substrate 200 in the protective region I, protective plugs 211 in the protective interlayer dielectric layers 213, and a protective metal layer 212 on the protective interlayer dielectric layer 213 and the protective plugs 211.

The electrical interconnect structure 220 may include one or more interconnect units (not labeled). The interconnect unit may include a device interlayer dielectric layer 223 on the semiconductor substrate 200 in the device region II, device plugs 221 passing through the device interlayer dielectric layer 223, and a device metal layer 212 on the device interlayer dielectric layer 223 and the device plugs 221.

In one embodiment, the device plug 221 may be connected with the device structure.

In one embodiment, the process for forming the seal ring structure 210 and the electrical interconnect structure 220 may include forming an interlayer dielectric layer on the semiconductor substrate 200 in the protective region I and the device region II. The portion of the interlayer dielectric layer in the protective region I may form the protective interlayer dielectric layer 213; and the portion of the interlayer dielectric layer in the device region II may form the device interlayer dielectric layer 223. The process may also include forming contact through-holes in the interlayer dielectric layer in the device region II and the protective region I, respectively; and forming plugs in the contact through-holes. The plugs in the protective region I may form the protective plugs 211; and the plugs in the device region II may form the device plugs 221. Further, the process may include forming a metal layer on the interlayer dielectric layer and the plugs. The portion of the metal layer in the protective region I may form the protective metal layer 212; and the portion of the metal layer in the device region II may form the device metal layer 222.

In one embodiment, the process for forming the metal layer on the plugs and the interlayer dielectric layer may include forming an initial metal layer on the plugs and the interlayer dielectric layer; and patterning the initial metal layer to form the metal layer.

In one embodiment, the interlayer dielectric layer is made of silicon oxide. In some embodiments, the interlayer dielectric layer may be made of silicon oxynitride, etc.

The interlayer dielectric layer may be formed by any appropriate process, such as a chemical vapor deposition (CVD) process, the physical vapor deposition (PVD) process, or an atomic layer deposition (ALD) process, etc.

In one embodiment, the plugs are made of Cu. In some embodiments, the plugs may be made of W, etc.

The plugs may be formed by any appropriate process, such as a CVD process, a PVD process, or a chemical plating process, etc.

In one embodiment, the metal layer is made of Al. In some embodiments, the metal layer may be made of CuAl, or Cu, etc.

The metal layer may be formed by any appropriate process, such as a CVD process, a PVD process, or a chemical plating process, etc.

In one embodiment, the seal ring structure 210 includes a plurality of protective units; and the electrical interconnect structure 220 includes a plurality of interconnect units. In some embodiments, the seal ring structure may only include a single protective unit; and the electrical interconnect structure may only include a single interconnect unit.

In one embodiment, the number of the protective units is equal to the number of the interconnect units.

In one embodiment, in the seal ring structure 210, the protective interlayer dielectric layers 213 may be stacked layer-by-layer along the direction perpendicular to the surface of the semiconductor substrate 200. In one embodiment, in the electrical interconnect structure 220, the device interlayer dielectric layers 223 may be stacked layer-by-layer along the direction perpendicular to the surface of the semiconductor substrate 200.

In one embodiment, the seal ring structure 210 and the electrical interconnect structure 220 may be formed by a plurality of fabrication processes used for forming the protective units and the interconnect units.

An interlayer dielectric layer, such as a top interlayer dielectric layer, may be subsequently formed on the seal ring structure 210 and the electrical interconnect structure 220. The interlayer dielectric layer may entirely cover the protective region I. The portion of the interlayer dielectric layer in the device region II may have an opening exposing the electrical interconnect structure.

Figure 4:
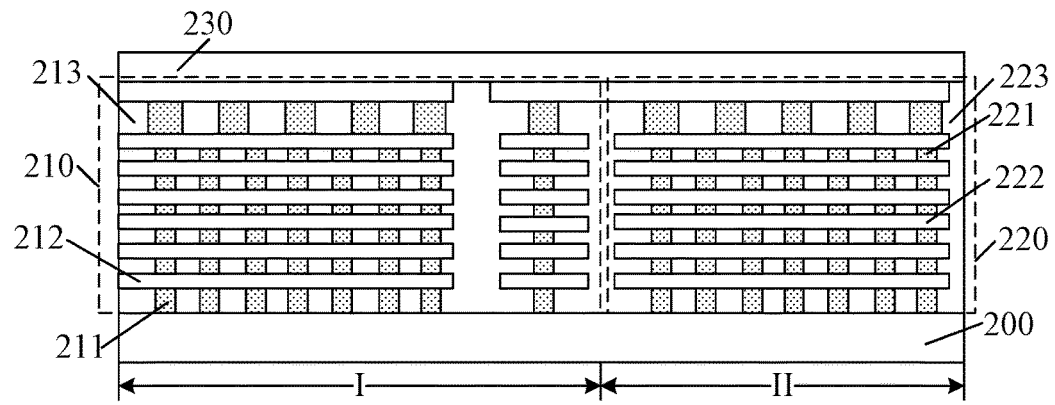

Returning to FIG. 11, after forming the seal ring structure and the electrical interconnect structure, an initial interlayer dielectric layer may be formed (S103). FIG. 4 illustrates a corresponding structure.

As shown in FIG. 4, an initial interlayer dielectric layer 230 is formed on the seal ring structure 210 and the electrical interconnect structure 220.

The initial interlayer dielectric layer 230 may be used to subsequently form an interlayer dielectric layer. The interlayer dielectric layer may be used to isolate the subsequently formed solder pads.

In one embodiment, the initial interlayer dielectric layer 230 may be on the surface of the seal ring structure 210 and the surface of the electrical interconnect structure 220. Further, the initial interlayer dielectric layer 230 may cover the top surface of the seal ring structure 210 entirely.

In one embodiment, the initial interlayer dielectric layer 230 is made of silicon oxide. In some embodiments, the initial interlayer dielectric layer may be made of silicon nitride, or silicon oxynitride, etc.

If the thickness of the initial interlayer dielectric layer 230 is too small, the isolation between the seal ring structure 210 and the external environments may be unacceptable; and the isolation among the solder pads in the device region II may be unacceptable neither. If the thickness of the initial interlayer dielectric layer 230 is too big, the process difficulty for subsequently etching the initial interlayer dielectric layer 230 may be increased. Thus, the thickness of the initial interlayer dielectric layer 230 may be in a range of approximately 700 Å-900 Å.

In one embodiment, the initial interlayer dielectric layer 230 may be formed by a CVD process, a PVD process, or an ALD process, etc.

Figure 5:
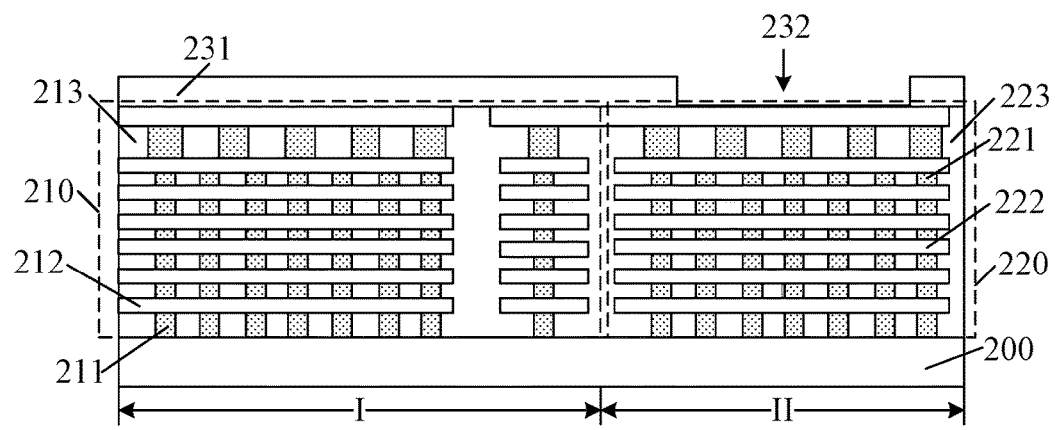

Returning to FIG. 11, after forming the initial interlayer dielectric layer, an interlayer dielectric layer may be formed (S104). FIG. 5 illustrates a corresponding structure.

As shown in FIG. 5, an interlayer dielectric layer 231 is formed. The interlayer dielectric layer 231 may have an opening 232 in the device region II. The opening 232 may expose a portion of the electrical interconnect structure 220. The interlayer dielectric layer 231 may be formed by etching the initial interlayer dielectric layer 230 in the device region II.

In one embodiment, the portion of the top initial interlayer dielectric layer 230 in the protective region I may not be etched. Thus, the interlayer dielectric layer 231 may cover the protective region I entirely.

The portion of the initial interlayer dielectric layer 230 in the device region II may be etched by any appropriate process, such as a dry etching process, or a wet etching process, etc. In one embodiment, a dry etching process is used to etch the portion of the initial interlayer dielectric layer 230 in the device region II to form the interlayer dielectric layer 231 having the opening 232. A solder pad may be subsequently formed in the opening 232.

The interlayer dielectric layer 231 and the initial interlayer dielectric layer 230 may be made of a same material. Specifically, the interlayer dielectric layer 231 may be made of silicon oxide. In some embodiments, the interlayer dielectric layer may be made of silicon nitride, or silicon oxynitride, etc.

In one embodiment, the thickness of the top interlayer dielectric 231 may be identical to the thickness of the initial interlayer dielectric layer 230. Specifically, the thickness of the interlayer dielectric layer 231 may be in a range of approximately 700 Å-900 Å.

Figure 6:
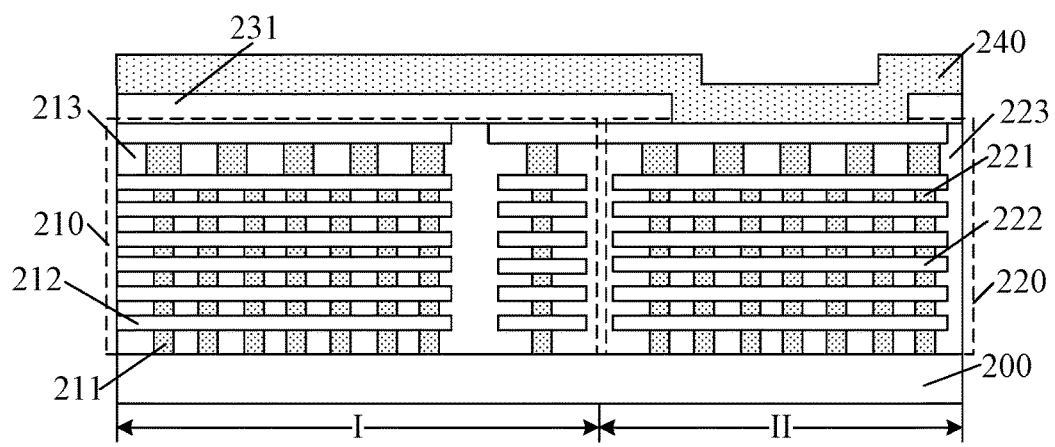

Returning to FIG. 11, after forming the interlayer dielectric layer having the opening, a metal layer may be formed (S105). FIG. 6 illustrates a corresponding structure.

As shown in FIG. 6, a metal layer such as a top metal layer 240 is formed in the opening 232 and on the interlayer dielectric layer 231. The metal layer 240 may be subsequently used to form a solder pad.

In one embodiment, the metal layer 240 is made of Al. In some embodiments, the metal layer may be made of Cu, or CuAl, etc.

Various processes may be used to form the metal layer 240, such as a CVD process, a PVD process, or a chemical plating process, etc.

If the thickness of the top metal layer 240 is too small, it may be difficult to form an electrical connection between the electrical interconnect structure and the external chip. If the thickness of the top metal layer 240 is too big, the difficulty for subsequently etching the top metal layer 240 may be increased. Thus, the thickness of the top metal layer 240 may be in a range of approximately 1 μm-1.4 μm.

Figure 7:
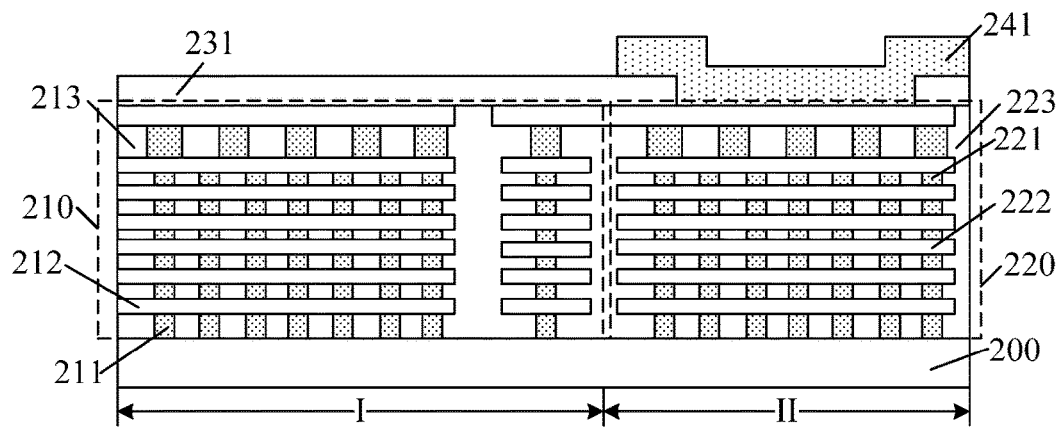

Returning to FIG. 11, after forming the top metal layer, a solder pad may be formed (S106). FIG. 7 illustrates a corresponding structure.

As shown in FIG. 7, a solder pad 241 is formed. The solder pad 241 may be formed by etching the top metal layer 240 to remove the portion of the top metal layer 241 in the protective region I.

In some embodiments, the number of the openings may be greater than one. Correspondingly, the number of the solder pads may be greater one.

In one embodiment, a portion of the top metal layer 240 in the device region II may also be removed to form the solder pad 241.

In one embodiment, referring to FIG. 5, the solder pad 241 may be in the opening 232 and on a portion of the surface of the interlayer dielectric layer 231 around the opening 232.

The top metal layer 240 may be etched by any appropriate process, such as a dry etching process, or a wet etching process, etc. In one embodiment, a dry etching process is used to etch to the top metal layer 240 to form the solder pad 241.

In one embodiment, the portion of the top metal layer 240 in the protective region I may be removed. Thus, the interlayer dielectric layer 231 in the protective region I may have no top metal layer. That is, there may be no electrical connection issue between the top metal layer 240 and the subsequently formed conductive wire in the protective region I. Thus, the performance of the semiconductor structure may be improved.

Figure 8:
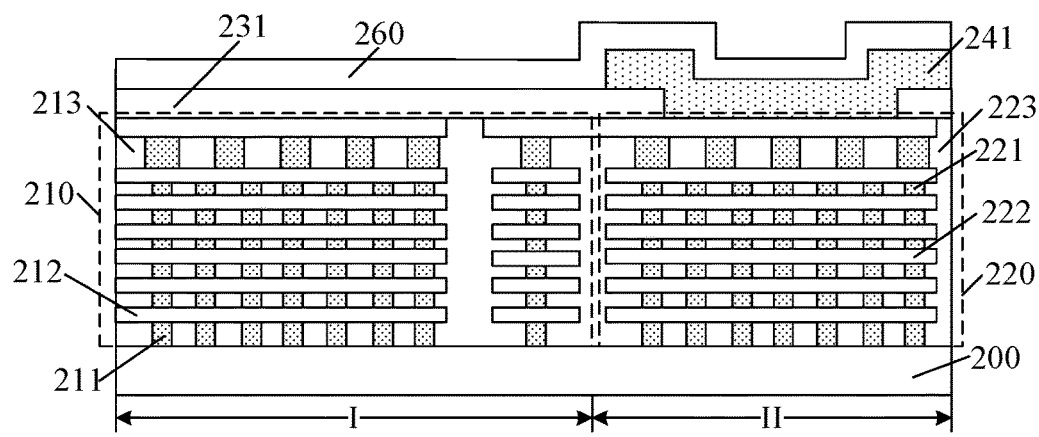

Returning to FIG. 11, after forming the solder pad, an initial passivation layer may be formed (S107). FIG. 8 illustrates a corresponding structure.

As shown in FIG. 8, an initial passivation layer 260 is formed on the solder pad 241 and the interlayer dielectric layer 231. The initial passivation layer 260 may be used to subsequently form a passivation layer.

In one embodiment, the portion of the surface of the interlayer dielectric layer 231 in the protective region I may have no top metal layer; and the portion of the interlayer dielectric layer 231 in the protective region I may have no opening. Thus, the surface of the interlayer dielectric layer 231 in the protective region I may be substantially smooth.

In one embodiment, the initial passivation layer 260 is made of silicon oxide. In some embodiments, the initial passivation layer may be made of silicon nitride, or silicon oxynitride, etc.

If the thickness of the initial passivation layer 260 is too small, the isolation performance between the electrical interconnect structure 210 and the subsequently formed conductive wire may not be acceptable. If the thickness of the initial passivation layer 260 is too big, the subsequent etching process may be difficult. Thus, in one embodiment, the thickness of the initial passivation layer 260 may be in a range of approximately 700 Å-900 Å.

In one embodiment, the initial passivation layer 260 is formed by a CVD process, a PVD process, or an ALD process, etc.

Returning to FIG. 11, after forming the initial passivation layer, a passivation layer may be formed (S108). FIG. 9 illustrates a corresponding structure.

As shown in FIG. 9, a passivation layer 261 is formed. The passivation layer 261 may be formed by etching the initial passivation layer 261 to expose a portion of the surface of the solder pad 241.

The passivation layer 261 may be used to isolate the subsequently formed conductive wire and the electrical interconnect structure 210.

In one embodiment, the portion of the interlayer dielectric layer 231 in the protective region I may have a smooth surface, the portion of the passivation layer 261 in the protective region I may also have a smooth surface. Further, the surface of the portion of the passivation layer 261 in the protective region I may be below the surface of the portion of the passivation layer 261 on the solder pad 241 in the device region II.

The initial passivation layer 260 may be etched by any appropriate process. In one embodiment, a dry etching process is used to etch the initial passivation layer 260 to form the passivation layer 261.

The passivation layer 261 and the initial passivation layer 260 may be made of a same material. Specifically, in one embodiment, the passivation layer 261 is made of silicon oxide. In some embodiments, the passivation layer 261 may be made of silicon nitride, or silicon oxynitride, etc.

The thickness of the passivation layer 261 may be identical to the thickness of the initial passivation layer 260. Specifically, in one embodiment, the thickness of the passivation layer 261 may be in a range of approximately 700 Å-900 Å

Returning to FIG. 11, after forming the passivation layer, a conductive wire may be formed (S109). FIG. 10 illustrates a corresponding structure.

As shown in FIG. 10, a conductive wire 250 is formed. The conductive wire 250 may be electrically connected to the solder pad 241. The conductive wire 250 may be across the passivation layer 261 in the protective region I.

The conductive wire 250 may be used to connect the solder pad 241 with an external chip. The electrical connection between the solder pad 241 and the external chip may be formed.

In one embodiment, the surface of the portion of the passivation layer 260 in the protective region I may be relatively low, the conductive wire 250 may be uneasy to contact with the passivation layer 261 in the protective region I. That is, even if defects may be formed in the passivation layer 261, it may be uneasy for the conductive wire 250 to connect with the seal ring structure 210. Thus, the leakage current may not be formed easily; and the performance of the semiconductor structure may be improved.

In one embodiment, an external chip 300 may be provided. The conductive wire 250 may be connected to the external chip 300.

In one embodiment, the conductive wire 250 is made of Cu. In some embodiments, the conductive wire may be made of Al, etc.

In the disclosed fabrication method of a semiconductor device, the conductive wire may need to be across the protective region to connect with the solder pad. Because the interlayer dielectric layer may entirely cover the seal ring structure, the passivation layer in the protective region may have no protruding portion. Thus, the passivation layer in the protective region may be not easy to contact with the conductive line. Accordingly, the isolation property between the seal ring structure and the conductive wire may be enhanced. Therefore, a leakage current may not be easy to form in the semiconductor structure; and the property of the semiconductor structure may be improved.

The present disclosure also provides a semiconductor structure. FIG. 10 illustrates an exemplary semiconductor structure consistent with the disclosed embodiments.

As shown in FIG. 10, the semiconductor structure includes a semiconductor substrate 200 having a device region II and a protective region I around the device region II. The semiconductor structure may also include a seal ring structure 210 on the semiconductor substrate 200 in the protective region I; and an electrical interconnect structure 220 on the semiconductor substrate 200 in the device region II. Further, the semiconductor structure may also include an interlayer dielectric layer 231 on the seal ring structure 210 and the electrical interconnect structure 220. The interlayer dielectric layer 231 may entirely cover the protective region I; and the portion of the interlayer dielectric layer 231 in the device region II may have an opening (not labeled) exposing the electrical interconnect structure 220. Further, the semiconductor structure may include a solder pad 241 in the opening; and a passivation layer 261 exposing the solder pad 241 on the interlayer dielectric layer 231. Further, the semiconductor structure may also include a conductive wire 250 connected to the solder pad 241 and across the portion of the passivation layer 261 in the protective region I.

The protective region I may be used to form a seal ring structure for protecting the device region II. The device region II may be used to formed device structure(s).

In one embodiment, the semiconductor substrate 200 is a planar substrate. In some embodiments, the semiconductor substrate may include a base substrate and a plurality of fins on the base substrate.

In one embodiment, the semiconductor substrate 200 is a silicon substrate. In some embodiments, the semiconductor substrate may be a germanium substrate, a silicon germanium substrate, a silicon-on-insulator (SOI) substrate, or a germanium-on-insulator (GOI) substrate, etc.

In one embodiment, the device structure is a CMOS transistor. The CMOS transistor may include a gate structure on the semiconductor substrate 200 in the device region II and doped source/drain regions in the semiconductor substrate 200 at two sides of the gate structure. In some embodiments, the device structure may be a diode, a transistor, or a resistor.

The electrical interconnect structure 220 may be used to form an electrical connection between the device structure(s) and an external chip. The seal ring structure 210 may be used to protect the device region II to reduce the interference of the external environment to the properties of the device structure(s).

In one embodiment, the seal ring structure 210 may include one or more protective units. The protective unit may include a protective interlayer dielectric layer 213 on the semiconductor substrate 200 in the protective region I; protective plugs 211 in the protective interlayer dielectric layer 213; and a protective metal layer 212 on the protective interlayer dielectric layer 213 and the protective plugs 211.

The electrical interconnect structure 220 may include one or more interconnect units. The interconnect unit may include a device interlayer dielectric layer 223; device plugs 221 passing through the device interlayer dielectric layer 223; and a device metal layer 222 on the device interlayer dielectric layer 223 and the device plugs 221.

In one embodiment, the device plugs 221 are connected to the device structure(s).

In one embodiment, the protective interlayer dielectric layer 213 and the device interlayer dielectric layer 223 are made of silicon oxide. In some embodiments, the protective interlayer dielectric layer and the device interlayer dielectric layer may be made of silicon nitride, or silicon oxynitride, etc.

In one embodiment, the protective plugs 211 and the device plugs 221 are made of Cu. In some embodiments, the protective plugs and the device plugs may be made of W, etc.

In one embodiment, the protective metal layer 212 and the device metal layer 222 are made of Al. In some embodiments, the protective metal layer and the device metal layer may be made of CuAl, or Cu, etc.

In one embodiment, the seal ring structure 210 includes a plurality of protective units; and the electrical interconnect structure 220 may include a plurality of interconnect units. In some embodiments, the seal ring structure may only include a single protective unit; and the electrical interconnect structure may only include a single interconnect unit.

In one embodiment, in the seal ring structure 210, the protective interlayer dielectric layers 212 may be stacked layer-by-layer along the direction perpendicular to the surface of the semiconductor substrate 200. In the electrical interconnect structure 210, the device interlayer dielectric layers 223 may be stacked layer-by-layer along a direction perpendicular to the surface of the semiconductor substrate 200.

If the thickness of the interlayer dielectric layer 231 is too small, the isolation property between the seal ring structure 210 and the external environment may be unacceptable; and the isolation property among different solder pads 241 may be unacceptable. If the thickness of the interlayer dielectric layer 231 is too big, the process difficulty for forming the interlayer dielectric layer 231 may be increased. In one embodiment, the thickness of the interlayer dielectric layer 231 may be in a range of approximately 700 Å-900 Å.

In one embodiment, the interlayer dielectric layer 231 may be on the surface seal ring structure 210 and the electrical interconnect structure 220; and the interlayer dielectric layer 231 in the protective region I may entirely cover the top surface of the seal ring structure 210, the isolation property between the conductive wire 250 and the seal ring structure 210 may be enhanced.

In one embodiment, the solder pad 241 may be made of Al. In some embodiments, the solder pad may be made of Cu, Al or CuAl, etc.

If the thickness of the solder pad 241 is too small, the electrical connection between the electrical interconnect structure 220 and the external chip may be unacceptable. If the thickness of the solder pad 241 is too big, the process difficulty for forming the solder pad 241 may be increased. In one embodiment, the thickness of the solder pad 241 may be in a range of approximately 1 μm-1.4 μm.

The portion of the interlayer dielectric layer 231 in the protective region I may have no solder pad and have no opening. Thus, the portion of the interlayer dielectric layer 231 in the protective region I may have a smooth surface.

In one embodiment, the passivation layer 261 may be made of silicon oxide. In some embodiments, the passivation layer may be made of silicon nitride, or silicon oxynitride, etc.

If the thickness of the passivation layer 260 is too small, the isolation property between the electrical interconnect structure 220 and the conducive wire 250 may be unacceptable. If the thickness of the passivation layer 261 is too big, the process difficulty for forming the passivation layer 261 may be increased. In one embodiment, the thickness of the passivation layer 261 may be in a range of approximately 700 Å-900 Å.

The conductive wire 250 may be used to electrically connect the solder pad 241 with the external chip.

The surface of the portion of the passivation layer 261 in the protective region I may be relatively low, the conductive wire 250 may not be easy to contact with the portion of the passivation layer 261 in the protective region I. That is, even if defects may be formed in the passivation layer 261, it may be uneasy to connect the conductive wire 250 with the seal ring structure 210. Thus, the leakage current issue may be uneasy to generate; and the performance of the semiconductor structure may be improved.

In one embodiment, the semiconductor structure may also include an external chip 300.

In one embodiment, the conductive wire 250 is made of Cu. In some embodiments, the conductive wire may be made of Al, etc.

Thus, in the disclosed semiconductor structure, the conductive wire may need to be across the protective region to connect the solder pad with the external chip. Because the seal ring structure may be entirely covered by the interlayer dielectric layer, the surface of the portion of the passivation layer in the protective region may have no protruding portion. Thus, the portion of the passivation layer in the protective region may not easy to contact with the conductive wire. Accordingly, the isolation property between the seal ring structure and the conductive wire may be enhanced. Thus, it may be uneasy to form a leakage current in the semiconductor structure; and the property of the semiconductor structure may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor structure, comprising:
   a semiconductor substrate having a device region and a protective region around the device region;
   a seal ring structure on the semiconductor substrate in the protective region;
   an electrical interconnect structure on the semiconductor substrate in the device region;
   an interlayer dielectric layer entirely covering the protective region on the seal ring structure and the electrical interconnect structure;
   a solder pad electrically connected with the electrical interconnect structure passing through a portion of the interlayer dielectric layer in the device region;
   a passivation layer on the interlayer dielectric layer and exposing the solder pad; and
   a conductive wire connected to the solder pad and across over a portion of the passivation layer in the protective region.

2. The semiconductor structure according to claim 1, further comprising:
   at least one device structure electrically connected with the electrical interconnect structure.

3. The semiconductor structure according to claim 1, wherein:
   the seal ring structure includes at least one protective unit; and
   the electrical interconnect structure includes at least one interconnect unit,
   wherein:
      the protective unit includes a protective interlayer dielectric layer on the semiconductor substrate in the protective region, protective plugs in the protective interlayer dielectric layer, and a protective metal layer on the protective interlayer dielectric layer and the protective plugs; and
      the interconnect unit includes an interconnect interlayer dielectric layer on the semiconductor substrate in the device region, device plugs passing through the device interlayer dielectric layer, and a device metal layer on the device interlayer dielectric layer and the device plugs.

4. The semiconductor structure according to claim 3, wherein:
   more than one protective unit is stacked layer-by-layer along a direction perpendicular to a surface of the semiconductor substrate; and
   more than one interconnect unit is stacked layer-by-layer along a direction perpendicular to the surface of the semiconductor substrate.

5. The semiconductor structure according to claim 3, wherein:
   the protective plugs are made of one of copper and tungsten; and
   the protective metal layer is made of one of copper, aluminum, and copper aluminum alloy.

6. The semiconductor structure according to claim 1, wherein:
   the conductive wire is made of one of copper and aluminum.

7. The semiconductor structure according to claim 1, wherein:
   the solder pad is made of one of copper, aluminum and copper aluminum alloy.

8. The semiconductor structure according to claim 1, wherein:
   the interlayer dielectric layer is made of one of silicon oxide, silicon nitride, and silicon oxynitride.

9. The semiconductor structure according to claim 1, wherein:
   the passivation layer is made of one of silicon oxide, silicon nitride, and silicon oxynitride.

10. The semiconductor structure according to claim 1, wherein:
    a thickness of the interlayer dielectric layer is in a range of approximately 700 Å-900 Å.

11. The semiconductor structure according to claim 1, wherein:
    a thickness of the passivation layer is in a range of approximately 700 Å-900 Å.

12. A method for fabricating a semiconductor structure, comprising:
    providing a semiconductor substrate having a device region and a protective region;
    forming an electrical interconnect structure on the semiconductor substrate in the device region;
    forming a seal ring structure on the semiconductor substrate in the protective region;

forming an interlayer dielectric layer on the seal ring structure and on the electrical interconnect structure to entirely cover the protective region and to expose the electrical interconnect structure by an opening;

forming a solder pad in the opening;

forming a passivation layer exposing the solder pad on a portion of the interlayer dielectric layer in the protective region; and forming a conductive wire connected with the solder pad and across over a portion of the passivation layer in the protective region.

13. The method according to claim 12, wherein forming the interlayer dielectric layer comprises:

forming an initial interlayer dielectric layer on the electrical interconnect structure and the seal ring structure; and etching the initial interlayer dielectric layer to form the interlayer dielectric layer and the opening in the portion of the interlayer dielectric layer in the device region.

14. The method according to claim 13, wherein:

the initial interlayer dielectric layer is etched by a dry etching process.

15. The method according to claim 13, wherein forming the solder pad comprises:

forming a metal layer in the opening and on the interlayer dielectric layer; and etching the metal layer to remove a portion of the metal layer in the protective region to form the solder pad in the opening.

16. The method according to claim 12, further comprising:

forming at least one device structure electrically connected with the electrical interconnect structure on the semiconductor substrate in the device region.

17. The method according to claim 12, wherein:

the seal ring structure includes at least one protective unit;

the electrical interconnect structure includes at least one interconnect unit;

the protective unit includes a protective interlayer dielectric layer on the semiconductor substrate in the protective region, protective plugs in the protective interlayer dielectric layer, and a protective metal layer on the protective interlayer dielectric layer and the protective plugs, and the interconnect unit includes an interconnect interlayer dielectric layer on the semiconductor substrate in the device region, device plugs passing through the device interlayer dielectric layer, and a device metal layer on the device interlayer dielectric layer and the device plugs.

18. The method according to claim 17, wherein forming the at least one protective unit and the at least one interconnect unit comprises:

forming an interlayer dielectric layer on the semiconductor substrate in the protective region and the device region, wherein a portion of the interlayer dielectric layer in protective region forms the protective interlayer dielectric layer and a portion of the interlayer dielectric layer in the device region forms the device interlayer dielectric layer;

forming contact through-holes in the protective interlayer dielectric layer and the device interlayer dielectric layer;

forming a plug in each of the contact through-holes, wherein the plugs in the device regions form the device plugs and the plugs in the protective region form the protective plugs; and forming a metal layer on the plugs and the interlayer dielectric layer, wherein a portion of the metal layer in the protective region forms the protective metal layer and a portion of the metal layer in the device region forms the device metal layer.

19. The method according to claim 12, wherein:

each of the passivation layer and the interlayer dielectric layer is formed by one of a chemical vapor deposition process, a physical vapor deposition process, and an atomic layer deposition process.

20. The method according to claim 12, wherein:

the interlayer dielectric layer is made of one of silicon oxide, silicon nitride, and silicon oxynitride; and the passivation layer is made of one of silicon oxide, silicon nitride, and silicon oxynitride.

* * * * *